July 12, 1960 C. R. WILHELMSEN 2,945,135

SIGNAL-TRANSLATING SYSTEM

Filed April 12, 1957

2,945,135

SIGNAL-TRANSLATING SYSTEM

Carl R. Wilhelmsen, Huntington Station, N.Y., assignor to Hazeltine Research, Inc., Chicago, Ill., a corporation of Illinois Filed Apr. 12, 1957, Ser. No. 652,577

8 Claims. (Cl. 307—88.5)

*General*

Figure 1:
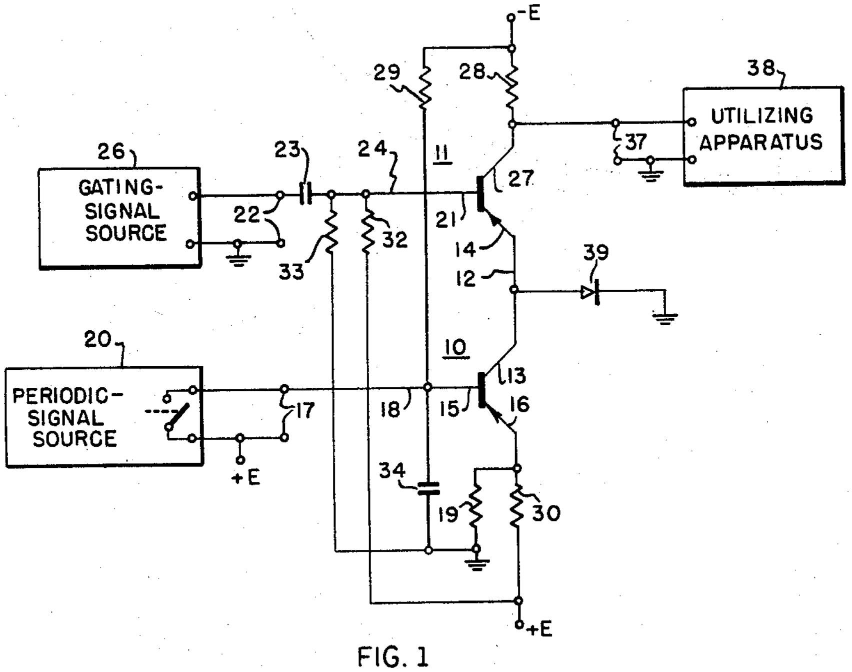

The present invention is directed to signal-translating systems employing semiconductors. Such systems are particularly useful for gating or switching operations and for sampling signals. Accordingly, the invention will be described in that connection.

Electron tubes such as the 6AS6 are available for use in circuits to perform sampling and switching operations. Insofar as applicant is aware, relatively simple and reliable circuits employing semiconductors have not been available to perform such operations.

It is an object of the present invention, therefore, to provide a new and improved semiconductor signal-translating system which is useful for current switching purposes, modulating functions, sampling, coincidence detection, gating, and other control purposes.

It is a further object of the invention to provide a new and improved signal-translating system employing transistors in portions thereof for control purposes.

In accordance with a particular form of the invention, a signal-translating system comprises means effectively including a pair of transistors of like conductivity type and each effectively including an emitter and a collector. This system further includes means effectively connecting the collector of the first of the pair directly with the emitter of the second thereof. The signal-translating system further includes a first signal-translating channel including the aforesaid transistors in cascade and output circuit means coupled between the emitter of the first and the collector of the second of the pair of transistors. The signal-translating system additionally includes a second signal-translating channel including unidirectionally conductive means coupled between the aforesaid connecting means and the emitter of the first transistor of the pair of transistors for controlling a signal-translating characteristic in said first signal translating channel.

For a better understanding of the present invention, together with other and further objects thereof, reference is had to the following description taken in connection with the accompanying drawing, and its scope will be pointed out in the appended claims.

Figure 2:
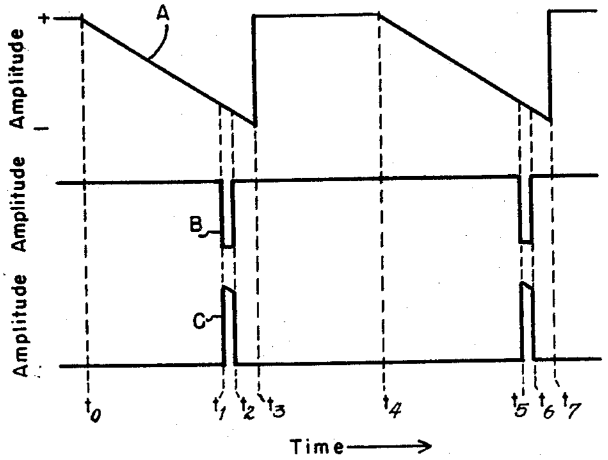

Referring to the drawing:

Fig. 1 is a circuit diagram, partly schematic, of a signal-translating system in accordance with the invention, and Fig. 2 is a graph utilized in explaining the operation of the system of Fig. 2.

*Description of signal-translating system of Fig. 1*

Referring now to Fig. 1 of the drawing, the signal-translating channel there represented will be considered as a gating or sampling system and it includes means effectively including a pair of transistors 10 and 11 of like conductivity type, for example junction transistors of the PNP type, each effectively including a base, an emitter, and a collector. The transistor 10 may be of the surface-barrier type, while transistor 11 may be of the drift type since it is to be subjected to a higher collector voltage than transistor 10. These transistors include means effectively connecting the collector of the first of the pair directly with the emitter of the second thereof. This means comprises the conductive connection 12 between the collector 13 of the transistor 10 and the emitter 14 of the transistor 11. For some applications the transistors 10 and 11 may be a multiple-unit transistor device having five contiguous zones of semiconductive material such as germanium, alternate zones being of the opposite conductivity type, in which case the intermediate zone serves as the collector of the first transistor and the emitter of the second transistor, thus eliminating the need for the physical or conductive connection 12 represented in the drawing. Multiple-unit transistor devices of this type are disclosed and claimed in application Serial No. 570,347, filed March 8, 1956, in the name of W. F. Bailey and entitled Signal-Translating Device.

The signal-translating system also includes a first input signal applying means coupled between the base 15 and the emitter 16 of the first transistor 10 for applying thereto a first signal which, in accordance with one embodiment of the invention, is to be sampled. This means includes a pair of terminals 17, 17 and a connection 18 between the ungrounded one of the terminals and the base 15 and further includes a resistor 19 connected between the emitter 16 and ground. This input signal applying means may also be considered to include a periodic-signal source 20 in the form of a normally closed but periodically operated switch having one terminal connected to a source indicated as +E and its other terminal connected to the conductor 18. While the source 20 may supply any suitable wave such as a sine wave or a saw-tooth wave to be sampled by the system, it will be considered hereinafter as delivering a negative-going saw-tooth wave as represented by curve A of Fig. 2 to the terminals 17, 17.

The signal-translating system further includes a second input signal applying means coupled to the base 21 of the second transistor 11 and the emitter 16 of the first transistor 10 for applying thereto a second signal in the form of a negative-going short-duration gating pulse, having a duration much less than that of the first signal or saw-tooth wave to be sampled. Such an input signal is represented by curve B of Fig. 2. The second input signal applying means comprises a pair of terminals 22, 22, one of which is grounded and the other of which is connected through a coupling condenser 23 and a conductor 24 to the base 21 of transistor 11. This means may further be considered to include a gating signal source 26, one terminal of which is grounded and the other terminal of which is connected to the condenser 23 for generating the pulse signal of curve B.

The signal-translating system of the present invention additionally includes means coupled to the transistors 10 and 11 for normally disabling both transistors in the absence of signals applied thereto from the sources 20 and 26. This means is a biasing means and includes a source of unidirectional potential −E which is connected to the collector 27 of transistor 11 through a resistor 28 and is also connected through a charging resistor 29 to the base 15 of transistor 10. A condenser 34 is connected between the base 15 and ground for varying the potential of the base 15 in a manner to be explained subsequently. The biasing means under consideration further includes a source +E which is connected through a resistor 30 to the emitter 16 of transistor 10 and, from this point, through the resistor 19 to ground. Source +E develops a positive potential considerably less than that of the negative source −E. Furthermore, the biasing means includes resistors 32 and 33 which are connected in series between the source +E and ground, the junction of these resistors being connected to the base 21 of transistor 11 for supplying a suitable positive potential thereto which normally maintains the transistor in a disabled or nontranslating state.

The signal-translating system comprises a first signal-translating channel including the transistors 11 and 10 and, more particularly, includes the circuit connections between the collector 27 of transistor 11 and the emitter 16 of transistor 10, that emitter being connected through ground to the resistor 19 as previously described. An output circuit means is coupled between the emitter 16 and the collector 27 of transistors 10 and 11, respectively, and comprises a pair of output terminals 37, 37, one of which is grounded and the other of which is connected directly to the collector 27. This output circuit means may also be considered to include a utilizing device 38 connected to the terminals 37, 37 for utilizing the derived samples of the saw-tooth wave represented by curve A.

The signal-translating system finally includes a second signal-translating channel including a unidirectionally conductive device which may be a crystal diode 39 coupled between the conductive connection 12 and the emitter 16 of transistor 10 and responsive to the pulses of curve B of Fig. 2 for controlling a characteristic of each of the two channels and deriving at the output terminals 37, 37 samples (see curve C of Fig. 2) of the saw-tooth wave of curve A which have a duration corresponding to that of the pulses of curve B. The other terminal of the diode 39 is connected to ground so that the second signal-translating channel extends from ground through the diode 39, the transistor 10 when it is in a translating or conductive state, and the resistor 19 between the emitter 16 and ground.

*Operation of signal-translating system of Fig. 1*

In considering the operation of the system of Fig. 1, it will be assumed that the transistors 10 and 11 are initially biased so that they are in their nonconducting or nontranslating state and that the periodically operated switch of the source 20 is in its closed position so that the source +E is connected directly to the base 15 of transistor 10. At time $t_0$ the switch of source 20 is automatically opened so that the condenser 34 connected to the base 15 begins to charge exponentially through resistor 29 from the higher potential source −E in the manner represented by curve A of Fig. 2. This charging continues until time $t_3$ whereupon the switch is closed and the potential across the condenser 34 changes suddenly and is restored to its initial value as determined by the source +E. At time $t_4$ the switch again opens and the condenser again charges toward the potential of the source −E until time $t_7$ whereupon the switch closes and the condenser is returned to its original potential, thus developing a pair of saw-tooth waves as represented by curve A. The negative-going voltage wave of curve A on the base 15 renders transistor 10 conductive so that positive-going saw-tooth waves are developed at the collector 13 of transistor 10 for application to the diode 39. In the absence of any control signal applied to the input terminals 22, 22, the diode 39 in the second signal-translating channel would be rendered conductive during the intervals $t_0$–$t_3$ and $t_4$–$t_7$. At times $t_1$–$t_2$ and $t_5$–$t_6$, short duration gating pulses as represented by curve B are applied to the input terminals 22, 22. Since these represent negative-going pulses as applied to the base 21 of the transistor 11, they are effective to place it in a conductive state so that a signal appearing on its emitter 14 will be translated to the collector 27 where it appears with opposite polarity. Because the transistor 11 is connected in an emitter-follower relation, the emitter 14 swings negatively substantially simultaneously with the negative swing of the pulses applied to the base 21. Any such negative swing effectively places the diode 39 in its nontranslating state and, therefore, disables the second signal-translating channel through that diode. Coincidence occurs during the intervals $t_1$–$t_2$ and $t_5$–$t_6$ between the signals applied to the base 15 of transistor 10 and the base 21 of transistor 11 so that the first signal-translating channel through those transistors is completed whereby an output signal is developed at the output terminals 37, 37. This output signal is represented by curve C of Fig. 2 and it will be noticed that the pulses thereof have durations corresponding to those of the pulses of curve B while the amplitudes of the pulses of curve B are representative of the amplitude of the saw-tooth wave of curve A during the intervals $t_1$–$t_2$ and $t_5$–$t_6$. Thus, the signal-translating system of Fig. 1 effectively acts as a sampling system and the amplitudes of the derived samples will depend upon the relative phases of the signals of curves A and B.

While the operation of the system of Fig. 1 has been described in relation to a sampling operation, it will be apparent to one skilled in the art that, if the signal applied to the input terminals 17, 17 is in the nature of short duration pulses having a phase which may vary relative to the phase of the gating or control pulses applied to the terminals 22, 22, an output signal will appear at the output terminals 37, 37 only during intervals of coincidence between the pulses applied to the two pairs of input terminals previously mentioned. The system of Fig. 1 then would be functioning as a coincidence detector and would be useful for decoding purposes for applying an output signal from the terminals 37, 37 to a suitable utilizing apparatus such as a transponder.

While applicant does not wish to be limited to any particular values of circuit constants, the following have proved to be useful in a system constructed in accordance with the circuit of Fig. 1:

| | |
|---|---|
| Resistor **19** | 10 kilohms. |
| Resistor **28** | 4.7 kilohms. |
| Resistors **29**, **32** | 18 kilohms. |
| Resistor **30** | 1 kilohm. |
| Resistor **33** | 1.2 kilohms. |
| Condenser **23** | 0.1 microfarad. |
| Condenser **34** | 560 microfarads. |
| Transistor **10** | Type 2N128 surface barrier transistor. |
| Transistor **11** | Type 2N247 drift transistor. |
| Diode **39** | Type IN305 crystal diode. |
| +E | +6 volts. |
| −E | −18 volts. |
| Voltage swing of wave of curve A | 6 volts. |

From the foregoing description it will be seen that a signal-translating system in accordance with the present invention is useful for current-switching purposes, sampling, coincidence detection, gating, and a variety of other control purposes.

While there has been described what is at present considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A signal-translating system comprising: means effectively including a pair of transistors of like conductivity type and each effectively including an emitter, a base, and a collector; means effectively connecting the collector of the first of said pair directly with the emitter of the second thereof; a first signal-translating channel including said transistors in cascade and output circuit means coupled between the emitter of said first and the collector of said second of said pair of transistors; and a second signal-translating channel including unidirectionally conductive means coupled between said connecting means and said emitter of said first transistor of said pair of transistors for controlling a signal-translating characteristic in said first signal-translating channel.

2. A signal-translating system comprising: means effectively including a pair of transistors of like conductivity type and each effectively including an emitter, a base, and a collector; means effectively connecting the collector of the first of said pair directly with the emitter of the second thereof; a first signal-translating channel including said transistors in cascade and output circuit means coupled between the emitter of said first and the collector of said second of said pair of transistors; and a second signal-translating channel including diode means connected between said connecting means and said emitter of said first transistor of said pair of transistors for controlling a signal-translating characteristic in said first signal-translating channel.

3. A signal-translating system comprising: means effectively including a pair of transistors of like conductivity type and each effectively including an emitter, a base, and a collector; means effectively connecting the collector of the first of said pair directly with the emitter of the second thereof; a first input signal applying means coupled between the base and the emitter of the first transistor; a second input signal applying means coupled between the base of the second transistor of said pair and said emitter of said first transistor; a first signal-translating channel including said transistors in cascade and output circuit means coupled between the emitter of said first and the collector of said second of said pair of transistors; and a second signal-translating channel including unidirectionally conductive means coupled between said connecting means and said emitter of said first transistor of said pair of transistors and responsive to an input signal from said second applying means for controlling a signal-translating characteristic in said first signal-translating channel.

4. A signal-translating system comprising: means effectively including a pair of transistors of like conductivity type and each effectively including a base, an emitter, and a collector; means effectively connecting the collector of the first of said pair directly with the emitter of the second thereof; a first input signal applying means coupled between the base and emitter of said first transistor for applying thereto a first signal; a second input signal applying means coupled between the base of said second transistor and said emitter of said first transistor for applying thereto a control signal; a first signal-translating channel including said transistors; and output circuit means coupled between the emitter of said first and the collector of said second of said pair of transistors; a second signal-translating channel including unidirectionally conductive means coupled between said connecting means and said emitter of said first of said pair of transistors and responsive to said control signal for controlling a signal-translating characteristic in said first signal translating channel for deriving in said output circuit an output signal related to said first signal and said control signal.

5. A signal-sampling system comprising: means effectively including a pair of transistors of like conductivity type and each effectively including a base, an emitter, and a collector; means effectively connecting the collector of the first of said pair directly with the emitter of the second thereof; a first input signal applying means coupled between the base and emitter of said first transistor for applying thereto a first signal to be sampled; a second input signal applying means coupled between the base of said second transistor and said emitter of said first transistor for applying thereto gating pulses; a first signal-translating channel including said transistors; and output circuit means coupled between the emitter of said first and the collector of said second of said pair of transistors; a second signal-translating channel including unidirectionally conductive means coupled between said connecting means and said emitter of said first of said pair of transistors and responsive to said gating pulses for controlling a signal-translating characteristic in said first signal-translating channel for deriving in said output circuit samples of said first signal having a duration corresponding to that of said gating pulses.

6. A signal-translating system comprising: means effectively including a pair of transistors of like conductivity type and each effectively including a base, an emitter, and a collector; means effectively connecting the collector of the first of said pair directly with the emitter of the second thereof; a first input signal applying means coupled between the base and emitter of said first transistor for applying thereto a first signal; a second input signal applying means coupled between the base of said second transistor and said emitter of said first transistor for applying thereto a control signal; biasing means coupled to said transistors for normally maintaining them in predetermined conductivity states; a first signal-translating channel including said transistors; and output circuit means coupled between the emitter of said first and the collector of said second of said pair of transistors; a second signal-translating channel including unidirectionally conductive means coupled between said connecting means and said emitter of said first of said pair of transistors and responsive to said control signal for controlling the conductivity states of said transistors and said unidirectionally conductive means and a signal-translating characteristic in said first signal-translating channel to derive in said output circuit an output signal related to said first signal and said control signal.

7. A signal-sampling system comprising: means effectively including a pair of transistors of like conductivity type and each effectively including a base, an emitter, and a collector; means effectively connecting the collector of the first of said pair directly with the emitter of the second thereof; a first input signal applying means coupled between the base and emitter of said first transistor for applying thereto a first signal to be sampled; a second input signal applying means coupled between the base of said second transistor and said emitter of said first transistor for applying thereto gating pulses; biasing means coupled to said transistors for normally disabling said transistors; a first signal-translating channel including said transistors; and output circuit means coupled between the emitter of said first and the collector of said second of said pair of transistors; a second signal-translating channel including unidirectionally conductive means coupled between said connecting means and said emitter of said first of said pair of transistors and responsive to said gating pulses for enabling said second transistor and said first channel while simultaneously disabling said unidirectionally conductive means and said second channel for the durations of said gating pulses to derive in said output circuit samples of said first signal having a duration corresponding to that of said gating pulses.

8. A coincidence detector system comprising: means effectively including a pair of transistors of like conductivity type and each effectively including a base, an emitter, and a collector; means effectively connecting the collector of the first of said pair directly with the emitter of the second thereof; a first input signal applying means coupled between the base and emitter of said first transistor for applying thereto a first negative-going signal; a second input signal applying means coupled between the base of said second transistor and said emitter of said first transistor for applying thereto negative-going pulses having a phase which may vary relative to that of said first signal; biasing means coupled to said transistors for normally disabling said transistors; a first signal-translating channel including said transistors; and output circuit means coupled between the emitter of said first and the collector of said second of said pair of transistors; a second signal-translating channel including unidirectionally conductive means coupled between said connecting means and said emitter of said first of said pair of transistors and responsive to said pulses during intervals of coincidence with said first signal for enabling said second transistor and simultaneously disabling said unidirectionally conductive means to derive in said output circuit an output signal.

References Cited in the file of this patent

UNITED STATES PATENTS

| | | |
|---|---|---|
| 2,627,039 | McWilliams | Jan. 27, 1953 |
| 2,629,834 | Trent | Feb. 24, 1953 |
| 2,632,046 | Goldberg | Mar. 17, 1953 |
| 2,703,368 | Wrathall | Mar. 1, 1955 |
| 2,730,632 | Curtis | Jan. 10, 1956 |
| 2,781,448 | Struven | Feb. 12, 1957 |
| 2,792,525 | McArdle | May 14, 1957 |
| 2,831,987 | Jones | Apr. 22, 1958 |